US006951710B2

United States Patent
Rieker et al.

(10) Patent No.: US 6,951,710 B2
(45) Date of Patent: Oct. 4, 2005

(54) COMPOSITIONS SUITABLE FOR REMOVING PHOTORESIST, PHOTORESIST BYPRODUCTS AND ETCHING RESIDUE, AND USE THEREOF

(75) Inventors: Jennifer M. Rieker, Bethlehem, PA (US); Thomas Wieder, Emmaus, PA (US); Dana L. Durham, Pittstown, NJ (US)

(73) Assignee: Air Products and Chemicals, Inc., Allentown, PA (US)

( * ) Notice: Subject to any disclaimer, the term of this patent is extended or adjusted under 35 U.S.C. 154(b) by 0 days.

(21) Appl. No.: 10/443,867

(22) Filed: May 23, 2003

(65) Prior Publication Data

US 2004/0234904 A1 Nov. 25, 2004

(51) Int. Cl.[7] ............................. G03F 7/30; G03F 7/32; C11D 9/00
(52) U.S. Cl. ...................... 430/331; 510/171; 510/176
(58) Field of Search .................... 430/331; 510/171, 510/176

(56) References Cited

U.S. PATENT DOCUMENTS

| 5,381,807 | A | | 1/1995 | Lee et al. |
| 5,381,808 | A | * | 1/1995 | Kamikawa .................. 134/61 |
| 5,795,702 | A | * | 8/1998 | Tanabe et al. ............. 430/331 |
| 5,911,835 | A | * | 6/1999 | Lee et al. ................... 134/1.3 |
| 6,291,142 | B1 | * | 9/2001 | Tanabe et al. ............. 430/331 |
| 6,455,497 | B1 | * | 9/2002 | Goronzy et al. ............ 514/12 |

* cited by examiner

Primary Examiner—Hoa Van Le
(74) Attorney, Agent, or Firm—Connolly, Bove, Lodge & Hutz, LLP

(57) ABSTRACT

Compositions containing certain amines and/or quaternary ammonium compounds, hydroxylamine, corrosion inhibitor, organic diluent and optionally water are capable of removing photoresist, photoresist byproducts and residue and etching residues from a substrate.

10 Claims, 1 Drawing Sheet

US 6,951,710 B2

COMPOSITIONS SUITABLE FOR REMOVING PHOTORESIST, PHOTORESIST BYPRODUCTS AND ETCHING RESIDUE, AND USE THEREOF

TECHNICAL FIELD

The present invention is concerned with selectively removing photoresist, photoresist byproducts and residues and etching residues from a substrate and particularly for selectively removing such without attacking metal also exposed to the composition used for removing the photoresist, photoresist byproducts and/or residues and/or etching residues. In addition, the present invention is concerned with certain compositions that are suitable for removing these materials.

BACKGROUND ART

In the fabrication of microelectronic components, a number of the steps involved, for instance, in preparing integrated circuit chips and the packaging for the chips (articles to which the chips are attached and protected), are etching processes. Accordingly, over the years, a number of vastly different types of etching processes to remove material, sometimes in selective areas, have been developed and are utilized to varying degrees. Moreover, the steps of etching different layers which constitute, for instance, the finished integrated circuit chip are among the most critical and crucial steps.

Positive-type resists have been extensively used as masking materials to delineate patterns onto a substrate and to form vias so that the patterns can be subsequently etched or otherwise defined into the substrate. The final step in preparing the substrate then involves removing the unexposed resist material from the substrate. Increasingly, however, plasma etching, reactive ion etching or ion milling is used to define the pattern in a substrate and to form vias which renders the resist mask extremely difficult to remove.

For instance, in complex semiconductor devices such as advanced DRAMS and logic devices with multiple layers of back end of line interconnect wiring, reactive ion etching (RIE) is used to produce vias through the interlayer dielectric to provide contact between one level of silicon, silicide or metal wiring to the next level of wiring. These vias typically expose, Al, AlCu, Cu, Ti, TiN, Ta, TaN, silicon or a silicide such as a silicide of tungsten, titanium or cobalt. The RIE process leaves a residue of a complex mixture that may include resputtered oxide material and possibly small amounts of organic material from the resist used to delineate the vias.

Likewise in fabricating conductive lines such as of aluminum, copper and their alloys, etching residues can be present on the conductive lines which must be removed.

It would therefore be desirable to provide a selective procedure capable of removing photoresist as well as the residues caused by the etching and especially a plasma, RIE or ion milling etching. Moreover, it would be desirable to provide a selective procedure capable of removing photoresist etching residues and that exhibits high selectivity for the residue as compared to metal, silicon, silicide and/or interlevel dielectric materials such as deposited oxides that might also be exposed to the cleaning composition.

SUMMARY OF INVENTION

The present invention provides compositions capable of selectively removing photoresist, photoresist byproducts, photoresist residue and/or etching residue from a substrate without attacking metal that might also be exposed to the composition. In addition, the present invention provides compositions that exhibit minimal metal etch rates.

More particularly, the present invention relates to compositions which comprise:
a) about 25–75% by weight of at least one amine represented by the formula: $NR_1R_2R_3$, wherein each of $R_1$, $R_2$ and $R_3$ individually is selected from the group consisting of H, aliphatic group, ether group, alkylmonoamine, alkyldiamine, alkyltriamine and a N heterocyclic group optionally containing at least one additional hetero atom selected from the group consisting of N, O and S in the ring; or at least one quaternary ammonium compound represented by the formula: $[NR_4, R_5, R_6, R_7]^+OH^-$ wherein each of $R_4, R_5, R_6,$ and $R_7$ individually is an alkyl group;
b) about 10 to about 25% by weight of hydroxylamine;
c) about 0 to about 32% by weight of an organic diluent;
d) about 10 to about 30% by weight of water; and having a pH of greater than 7.

Another aspect of the present invention relates to a method for removing post etching residue, residual photoresist and/or photoresist byproducts from a substrate which comprises contacting the substrate with a composition as disclosed above.

A still further aspect of the present invention relates to a method for removing photoresist from a substrate which comprises contacting the substrate with a composition as disclosed above.

Other objectives and advantages of the present invention will become readily apparent to those skilled in the art from the following detailed description, wherein it is shown and described only the preferred embodiments of the invention, simply by way of illustration of the best mode contemplated of carrying out the invention. As will be realized, the invention is capable of other and different embodiments, and its several details are capable of modification in various apparent respects, without departing from the invention. Accordingly, the drawings and description are to be regarded as illustrative in nature and not as restrictive.

BEST AND VARIOUS MODES FOR CARRYING OUT INVENTION

Figure 1:
FIG. 1 is a SEM of a metal line with sidewall polymer before cleaning.

The present invention is concerned with selectively removing photoresist and/or etching residues and especially residues caused by, but not limited to, reactive ion etching. Moreover, the photoresist and/or etching residues are present in or on an article that also includes metal, silicon, silicate and/or interlevel dielectric material such as deposited silicon oxides, wherein both photo-resist and/or residues and the metal, silicon, silicide and/or interlevel dielectric materials will come in contact with the cleaning composition. The metal is typically copper, copper alloy, titanium, titanium nitride, tantalum, tantalum nitride, aluminum and/ or aluminum alloy. The residues removed according to the present invention are preferably, but not limited to, those treated by reactive ion etching.

The compositions of the present invention typically comprises about 25 to about 75% by weight, more typically about 25% to about 40% by weight and preferably about 25% to about 30% by weight of at least one amine represented by the formula: $NR_1R_2R_3$ wherein each $R_1$, $R_2$ and $R_3$ individually is selected from the group consisting of H, aliphatic group, ether group, alkylmonoamino group, alkyldiamino group, alkyltriamino group, and a N heterocyclic group optionally containing at least one additional hetero atom selected from the group consisting of N, O and S in the ring; or at least one quaternary ammonium compound represented by the formula: $[NR_4R_5R_6R_7]^-OH$ wherein each of $R_4$, $R_5$, $R_6$ and $R_7$ individually is an alkyl group.

Suitable aliphatic groups include straight or branched chain alkyl groups, alkylene groups, alkyne, aryl, aryl-alkyl, alkyl-aryl and substituted aryl groups.

Ether groups include acrylic ethers typically having 1–12 carbon atoms.

Amino groups include primary, secondary and tertiary amines as well as higher alkyl amino functionality such as di- and tri-amines.

Listed below are definitions of various terms used to describe this invention. These definitions apply to the terms as they are used throughout this specification, unless otherwise limited in specific instances, either individually or as part of a larger group.

The term "alkyl" refers to straight or branched chain unsubstituted hydrocarbon groups of 1 to 20 carbon atoms, preferably 1 to 8 carbon atoms. The expression "lower alkyl" refers to alkyl groups of 1 to 4 carbon atoms.

The terms "alkenyl" and "alkynyl" refer to straight or branched chain unsaturated hydrocarbon groups typically having 2 to 8 carbon atoms.

The term "aryl" refers to monocyclic or bicyclic aromatic hydrocarbon groups having 6 to 12 carbon atoms in the ring portion, such as phenyl, naphthyl, biphenyl and diphenyl groups, each of which may be substituted.

Examples of some monocyclic heterocyclic groups typically contain 5 or 6 atoms in the ring and include morpholino, piperazine, isothiazole, imidazoline, pyrazoline, pyrazolidine, pyrimidine, pyrazine.

Examples of some ether groups are methoxy, ethoxy, propoxy, butoxy, isopropoxy, isobutoxy, sec-butoxy and tert-butoxy.

Examples of suitable alkyl groups include methyl, ethyl and propyl.

A preferred aryl group is phenyl.

The term "aralkyl" or "alkylaryl" refers to an aryl group bonded directly to an alkyl group, such as benzyl or phenethyl. The term "substituted aryl" or "substituted alkylaryl" refers to an aryl group or alkylaryl group substituted by, for example, one to four substituents such as alkyl; substituted alkyl, halo, trifluoromethoxy, trifluoromethyl, hydroxy, alkoxy, azido, cycloalkyloxy, heterocyclooxy, alkanoyl, alkanoyloxy, amino, alkylamino, aralkylamino, hydroxyalkyl, aminoalkyl, azidoalkyl, alkenyl, alkynyl, allenyl, cycloalkylamino, heterocycloamino, dialkylamino, thiol, alkylthio, cycloalkylthio, heterocyclothio, ureido, nitro, cyano, carboxy, carboxyalkyl, carbamyl, alkoxycarbonyl, alkylthiono, arylthiono, alkylsulfonyl, sulfonamide, aryloxy and the like. The substituent may be further substituted by halo, hydroxy, alkyl, alkoxy, aryl, substituted aryl, substituted alkyl or aralkyl. "Substituted benzyl" refers to a benzyl group substituted by, for example, any of the groups listed above for substituted aryl.

Preferred amines employed according to the present invention are the aminoalkylmorpholines such as aminopropylmorpholine and aminoalkylpiperazines such as aminoethylpiperazine.

The compositions of the present invention also include typically about 5% by weight to about 25% by weight, more typically about 10% to about 20% by weight, and preferably about 12% to about 18% by weight of hydroxylamine. The hydroxylamine has the formula $NH_2OH$.

The compositions of the present invention also typically contain about 0–32% by weight, more typically about 10% to about 30% by weight, preferably about 15% to about 30% by weight, and most preferably about 20% to about 30% by weight of an organic diluent. The organic diluent is water miscible. Typically organic diluents employed according to the present invention are alcohols and more typically alcohols represented by at least one of the following:

$R_{11}$—$(CHOH)_n$—$R_{12}$;

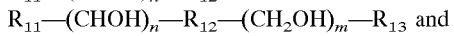, wherein n is an integer from 1 to 20 and preferably from 1 to 4, and m is an integer from 1 to 20 and preferably 1 to 4, and each of $R_{11}$, $R_{12}$ and $R_{13}$ individually is H, alkyl, aryl or alkoxy.

Examples of suitable alkyl are straight or branched chain unsubstituted hydrocarbon groups of 1 to 20 carbon atoms, preferably 1 to 8 carbon atoms and most preferably 1 to 4 carbon atoms.

Suitable aryl groups include monocyclic or bicyclic aromatic hydrocarbon groups having 6 to 12 carbon atoms in the ring portion, such as phenyl, napthyl; biphenyl and diphenyl groups. A preferred aryl group is phenyl.

Examples of suitable alkyl groups include methyl, ethyl, and propyl.

Typical alkoxy groups contain 1–12 carbon atoms. Examples of some alkoxy groups are methoxy, ethoxy, propoxy, butoxy, isopropoxy, isobutoxy, sec-butoxy and tert-butoxy.

Examples of some typical organic diluents are propylene glycol, tripropylene glycol methyl ether, 1,4-butanediol, propylene glycol propyl ether, diethylene gycol n-butyl ether(e.g commercially available under the trade designation Dowanol DB), hexyloxypropylamine, poly(oxyethylene) diamine and tetrahydrofurfuryl alcohol(THFA). The preferred diluents are the alcohols.

Mixtures of diluents can be used when desired.

The compositions according to the present invention also optionally contains a corrosion inhibitor. A corrosion inhibitor is preferred when the composition is to be used on metallic substrates.

Examples of corrosion inhibitors are aromatic hydroxyl compounds, acetylenic alcohols, carboxyl group containing organic compounds and anhydrides thereof, and triazole compounds.

Exemplary aromatic hydroxyl compounds include phenol, cresol, xylenol, pyrocatechol, resorcinol, hydroquinone, pyrogallol, 1.2.4-benzenetriol, salicyl alcohol, p-hydroxybenzyl alcohol, o-hydroxybenzyl alcohol, p-hydroxyphenethyl alcohol, p-aminophenol, m-aminophenol, diaminophenol, amino resorcinol, p-hydroxybenzoic acid, o-hydroxybenzoic acid 2,4-dihydroxybenzoic acid, 2-5-dihydroxybenzoic acid, 3,4-dihydroxybenzoic acid and 3,5-dihydroxybenzoic acid.

Exemplary acetylenic alcohols include 2-butyne-1,4-diol, 3,5-dimethyl-1-hexyn-3-ol, 2 methyl-3-butyn-2-ol, 3-methyl-1-pentyn-3-ol, 3,6-dimethyl-4-octyn-3,6-diol, 2,4-7,9-tetramethyl-5-decyne-4,7-diol and 2,5-dimethyl-3-hexyne 2,5-diol.

Exemplary carboxyl group containing organic compounds and anhydrides thereof include formic acid, acetic acid, propionic acid, butyric acid, isobutyric acid, oxalic acid, malonic acid, succinic acid, glutaric acid, maleic acid, fumaric acid, benzoic acid, phthalic acid, 1,2,3-benzenetricarboxylic acid, glycolic acid, lactic acid, malic acid citric acid, acetic anhydride and salicylic acid.

Exemplary triazole compounds include benzotriazole, o-tolyltriazole, m-tolyltriazole, p-tolyltriazole, carboxybenzotriazole, 1-hydroxybenzotriazole, nitrobenzotriazole and dihydroxypropylbenzotriazole.

Preferred inhibitors are catechol, gallic acid, pyrogallol, 4-methyl catechol fumaric acid and diethylhydroxylamine (DEHA).

The amount of the corrosion inhibitor, when present, is typically about 1 to about 25%, more typically about 1 to about 7% and preferable about 3% to about 5% by weight.

The composition also contains water. The amount of water is typically about 10 to about 30% by weight.

The compositions of the present invention typically have a pH greater than 7 and more typically about 7.5 to about 13.

The compositions of the present invention are free or at least substantially free from alkanol amines (i.e., can contain at most less than 10% of alkanol amines).

The compositions of the present invention are effective in removing a wide range of positive photoresists such as photoresists containing esters or ortho-naphthoquinones and novolak-type binders and chemically amplified resists containing blocked polyhydroxystyrene or copolymers of polyhydroxystyrene and photoacid generators. Examples of commercially available photoresist compositions which the stripping compositions with the stripping compositions of the present invention effectively remove from a substrate include Clariant Corporation AZ 1518, AZ 4620, Shipley Company, Inc. photoresists, S1400, APEX-E™ positive DUV, UV5™ positive DUV, Megaposit™ SPR™ 220 Series; JSR Microelectronics photoresists KRF® Series, ARF® Series; and Tokyo Ohka Kogyo Co., Ltd. Photoresists TSCR Series and TDUR-P/N Series.

Examples of substrates from which the compositions of the present invention remove photoresists and/or post etch residues without attacking the substrates themselves include metal substrates such as aluminum titanium/tungsten, and aluminum/silicon, aluminum/silicon/copper; and substrates such as silicon oxide, silicon nitride, and gallium/arsenide.

The method of removing photoresist and/or post etch residues according to the present invention can include applying a photoresist onto a substrate to provide a photoresists layer; exposing the applied photoresist layer to light through a mask pattern and developing the exposed photoresist layer in the usual manner to form a photoresist pattern; the substrate through the photoresist pattern by a known procedure; optionally performing another modification treatment such as ashing or ion implantation; and contacting the substrate with the resist composition of the invention by suitable means such as immersion.

The following examples are provided for the purpose of further illustrating the present invention but are by no means intended to limit the same.

| Components | Composition |
|---|---|
| Example 1 | |
| Propylene Glycol | 20.00% |
| Aminopropylmorpholine (APM) | 39.20% |
| Hydroxylamine (50%) | 36.10% |
| Catechol | 4.70% |
| Example 2 | |
| Propylene Glycol | 20.00% |
| Aminopropylmorpholine (APM) | 36.50% |
| Hydroxylamine (50%) | 32.00% |
| Water | 10.00% |
| Gallic Acid | 1.50% |
| Example 3 | |
| Tri-Propylene Glycol Methyl Ether (t-PGME) | 20.00% |
| Aminopropylmorpholine (APM) | 36.50% |
| Hydroxylamine (50%) | 32.00% |
| Water | 10.00% |
| Gallic Acid | 1.50% |
| Example 4 | |
| 1,4-Butanediol | 29.60% |
| Aminopropylmorpholine (APM) | 29.60% |
| Hydroxylamine (50%) | 36.10% |
| Catechol | 4.70% |
| Example 5 | |
| Dowanol DB | 29.60% |
| Aminopropylmorpholine (APM) | 29.60% |
| Hydroxylamine (50%) | 36.10% |
| Catechol | 4.70% |
| Example 6 | |
| Propylene Glycol Propyl Ether (PGPE) | 20.00% |
| Aminopropylmorpholine | 39.20% |
| Hydroxylamine (50%) | 36.10% |
| Catechol | 4.70% |
| Example 7 | |
| Propylene Glycol | 20.00% |
| Aminopropylmorpholine (APM) | 35.00% |
| Hydroxylamine (50%) | 32.00% |
| Water | 10.00% |
| Pyrogallol | 3.00% |
| Example 8 | |
| Propylene Glycol | 28.00% |
| Aminopropylmorpholine (APM) | 28.00% |
| Hydroxylamine (50%) | 31.00% |
| Water | 9.00% |
| Gallic Acid | 2.00% |
| Catechol | 2.00% |
| Example 9 | |
| Propylene Glycol | 28.50% |
| Aminoethylpiperzine | 28.50% |
| Hydroxylamine (50%) | 31.00% |
| Water | 8.00% |
| 4-methylcatechol | 4.00% |
| Example 10 | |
| Propylene Glycol | 28.00% |
| Diethylenetriamine | 28.00% |
| Hydroxylamine (50%) | 31.00% |
| Water | 8.00% |
| Gallic acid | 2.50% |
| Catechol | 2.50% |

The above formulations are tested for etch rate. The ability of the inhibitors to prevent corrosion when exposed to the formulations from this invention, were measured according to the ASTM procedure F533-02a Standard Test Method for Thickness and Thickness Variation of Silicon Wafers. Some aluminum and titanium etch rate results are listed below:

| Ex. 1 | Ex. 2 | Ex. 3 | Ex. 4 | Ex. 5 | Ex. 7 | Ex. 8 | Ex. 9 | Ex. 10 |
|---|---|---|---|---|---|---|---|---|
| 3 | 9 | 17 | 9 | 17 | 6 | 11 | 7 | 4 |
| 41 | 57 | 101 | 51 | 50 | 19 | 51 | 35 | 5 |

Tests were run at 75° C. Results are in A/min.

Figure 2:
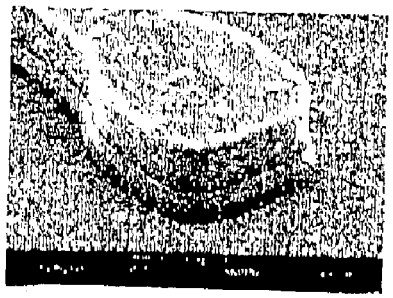
FIG. 2 is a SEM of the metal line of FIG. 1 after cleaning with a composition according to present invention.

Cleaning tests were tested whereby structures having post etch residue are contacted with composition of the present invention, followed by deionized water wash and $N_2$ dry. A comparison of FIGS. 1 and 2 show scanning electron micrographics of a metal line with sidewall polymer before cleaning with a composition of the present invention (FIG. 1) and the metal line after cleaning with the composition of Example 2 at 65° C. for 15 minutes (FIG. 2).

Figure 3:
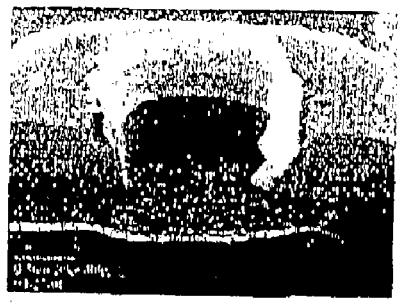
FIG. 3 is a SEM of a post etched via with etch residue before cleaning.
Figure 4:
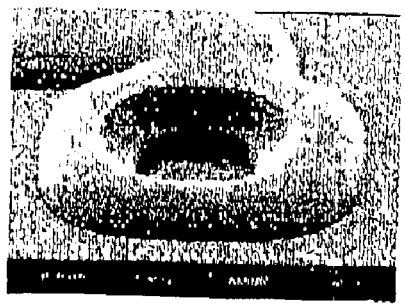
FIG. 4 is a SEM of the post etch via of FIG. 3 after cleaning with a composition according to the present invention.

A comparison of FIGS. 3 and 4 shows scanning electron micrographs of a post etched via with etch residue before cleaning with a composition of the present invention (FIG. 3) and the post etched via after cleaning with the composition of Example 2 at 75° C. for 15 minutes(FIG. 4).

The foregoing description of the invention illustrates and describes the present invention. Additionally, the disclosure shows and describes only the preferred embodiments of the invention but, as mentioned above, it is to be understood that the invention is capable of use in various other combinations, modifications, and environments and is capable of changes or modifications within the scope of the inventive concept as expressed herein, commensurate with the above teachings and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

What is claimed is:

1. A composition being free from an alkanol amine wherein the composition comprises
   a) about 25–75% by weight of at least one amine represented by the formula:
   $NR_1R_2R_3$ wherein each of $R_1$, $R_2$ and $R_3$ individually is selected from the group consisting of H, aliphatic group, ether group, amino group and aryl group, and an N heterocyclic group optionally containing at least one additional hetero atom selected from the group consisting of N, O and S in the ring; or at least one quaternary ammonium compound represented by the formula
   $[NR_4R_5R_6R_7]^-OH$ wherein each of $R_4$, $R_5$, $R_6$ and $R_7$ individually is an alkyl group;
   b) about 10 to about 25% by weight of hydroxylamine;
   c) about 0 to about 32% by weight of an organic diluent;
   d) about 10 to about 30% by weight of water;
   e) about 1 to about 25% by weight of a corrosion inhibitor; and
   having a pH of greater than 7.

2. The composition of claim 1 wherein a) comprises an aminoalkylmorpholine.

3. The composition of claim 1 wherein a) comprises aminopropylmorpholine.

4. The composition of claim 1 wherein the organic diluent comprises a water miscible alcohol.

5. The composition of claim 4 wherein the alcohol is represented by at least one of the following:

$R_{11}$—$(CHOH)_n$—$R_{12}$;
$R_{11}$—$(CHOH)_n$—$R_{12}$—$(CHOH)_m$—$R_{13}$;
$R_{11}$—$(CHOH)_n(CR_{12}OH)_mR_{13}$ wherein
n is an integer from 1 to 20
m is an integer from 1 to 20,
and each $R_{11}$, $R_{12}$ and $R_{13}$ individually is H, alkyl, aryl, or alkoxy.

6. The composition of claim 4 wherein the alcohol comprises at least one member selected from the group consisting of propylene glycol, tripropylene glycol methylether; 1,4-butanediol, propylene glycol propyl ether, diethylene gycol n-butyl ether, hexyloxypropylamine, poly(oxyethylene)diamine and tetrahydrofurfuryl alcohol.

7. The composition of claim 1 wherein the inhibitor comprises at least one member selected from the group consisting of catechol, 4-methylcatechol, fumaric acid, gallic acid and pyrogallol.

8. The composition of claim 1 have a pH of about 7.5 to about 13.

9. A method of removing post etching residue, residual photoresist and/or photoresist byproducts from a substrate which comprises contacting a substrate having thereon at least one member selected from the group consisting of etching residue, residual photoresist and photoresist byproducts with a composition being free from an alkanol amine wherein the composition comprises
   a) about 25–75% by weight of at least one amine represented by the formula:
   $NR_1R_2R_3$, wherein each of $R_1$, $R_2$ and $R_3$ individually is selected from the group consisting of H, aliphatic group, ether group, amino group and aryl group, and an N heterocyclic group optionally containing at least one additional hetero atom selected from the group consisting of N, O and S in the ring; or at least one quaternary ammonium compound represented by the formula
   $[NR_4R_5R_6R_7]^-OH$ wherein each of $R_4$, $R_5$, $R_6$ and $R_7$ individually is an alkyl group;
   b) about 10 to about 25% by weight of hydroxylamine;
   c) about 0 to about 32% by weight of an organic diluent;
   d) about 10 to about 30% by weight of water;
   e) about 1 to about 25% by weight of a corrosion inhibitor; and having a pH of greater than 7.

10. A method of removing photoresist from a substrate which comprises contacting a substrate having photoresist thereon with a composition being free from an alkanol amine wherein the composition comprises
   a) about 25–75% by weight of at least one amine represented by the formula:
   $NR_1R_2R_3$, wherein each of $R_1$, $R_2$ and $R_3$ individually is selected from the group consisting of H, aliphatic group, ether group, amino group and aryl group, and an N heterocyclic group optionally containing at least one additional hetero atom selected from the group consisting of N, O and S in the ring; or at least one quaternary ammonium compound represented by the formula
   $[NR_4R_5R_6R_7]^-OH$ wherein each of $R_4$, $R_5$, $R_6$ and $R_7$ individually is an alkyl group;
   b) about 10 to about 25% by weight of hydroxylamine;
   c) about 0 to about 32% by weight of an organic diluent;
   d) about 10 to about 30% by weight of water;
   e) about 1 to about 25% by weight of a corrosion inhibitor; and having a pH of greater than 7.

* * * * *